(12) United States Patent
Tateyama et al.

(10) Patent No.: US 7,101,646 B2
(45) Date of Patent: Sep. 5, 2006

(54) DEVELOPING METHOD AND APPARATUS

(75) Inventors: Kiyohisa Tateyama, Kumamoto-Ken (JP); Masafumi Nomura, Kumamoto-Ken (JP); Taketora Shinogi, Kumamoto-Ken (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 11/229,534

(22) Filed: Sep. 20, 2005

(65) Prior Publication Data

US 2006/0024622 A1 Feb. 2, 2006

Related U.S. Application Data

(62) Division of application No. 10/706,091, filed on Nov. 13, 2003, now Pat. No. 6,969,572.

(30) Foreign Application Priority Data

Nov. 15, 2002 (JP) ............................. 2002-332578

(51) Int. Cl.
*G03F 7/30* (2006.01)
(52) U.S. Cl. ....................... 430/30; 430/399
(58) Field of Classification Search ................. 430/30, 430/399
See application file for complete search history.

(56) References Cited

U.S. PATENT DOCUMENTS

| | | | |
|---|---|---|---|
| 5,223,881 A | 6/1993 | Nakagawa et al. | 354/298 |
| 5,945,161 A | 8/1999 | Hashimoto et al. | 427/240 |
| 5,965,200 A | 10/1999 | Tateyama et al. | 427/240 |
| 6,090,205 A | 7/2000 | Sakai et al. | 118/500 |
| 6,120,945 A | 9/2000 | Tanaka et al. | 430/7 |
| 6,569,609 B1* | 5/2003 | Timpe et al. | 430/399 |
| 6,588,927 B1* | 7/2003 | Nakagawa et al. | 366/152.3 |
| 6,752,545 B1 | 6/2004 | Nakagawa et al. | 396/611 |
| 2002/0146251 A1* | 10/2002 | Nakagawa et al. | 396/564 |
| 2003/0096199 A1* | 5/2003 | Nakagawa et al. | 430/325 |

FOREIGN PATENT DOCUMENTS

| | | |
|---|---|---|
| JP | 8-45832 | 2/1996 |
| JP | 9-7939 | 1/1997 |
| JP | 10-321517 | 12/1998 |

* cited by examiner

*Primary Examiner*—Hoa Van Le
(74) *Attorney, Agent, or Firm*—Oblon, Spivak, McClelland, Maier & Neustadt, P.C.

(57) ABSTRACT

In this developing method and apparatus, a concentration measuring unit 222 picks part of developing fluid in a blending tank 186 to measure the resist concentration by an absorption photometry and feeds the detected resist concentration to a control unit 240. The control unit 240 controls respective valves 210, 212, 216 of a TMAH concentrate solution 200, a solvent pipe 204 and a drain pipe 208 in a manner that the developing fluid in the blending tank 186 has a TMAH concentration corresponding to a measured resist-concentration value to accomplish a constant developing rate, performing component control of the developing fluid. The developing fluid transferred from the blending tank 186 to a supply tank 188 is fed to a developer nozzle DN in a developing section 126 through a developer pipe 224 owing to the drive of a pump 228. Accordingly, even if the developing fluid is reused in the developing process in multiple times, it is possible to make sure of the uniformity in development.

4 Claims, 7 Drawing Sheets

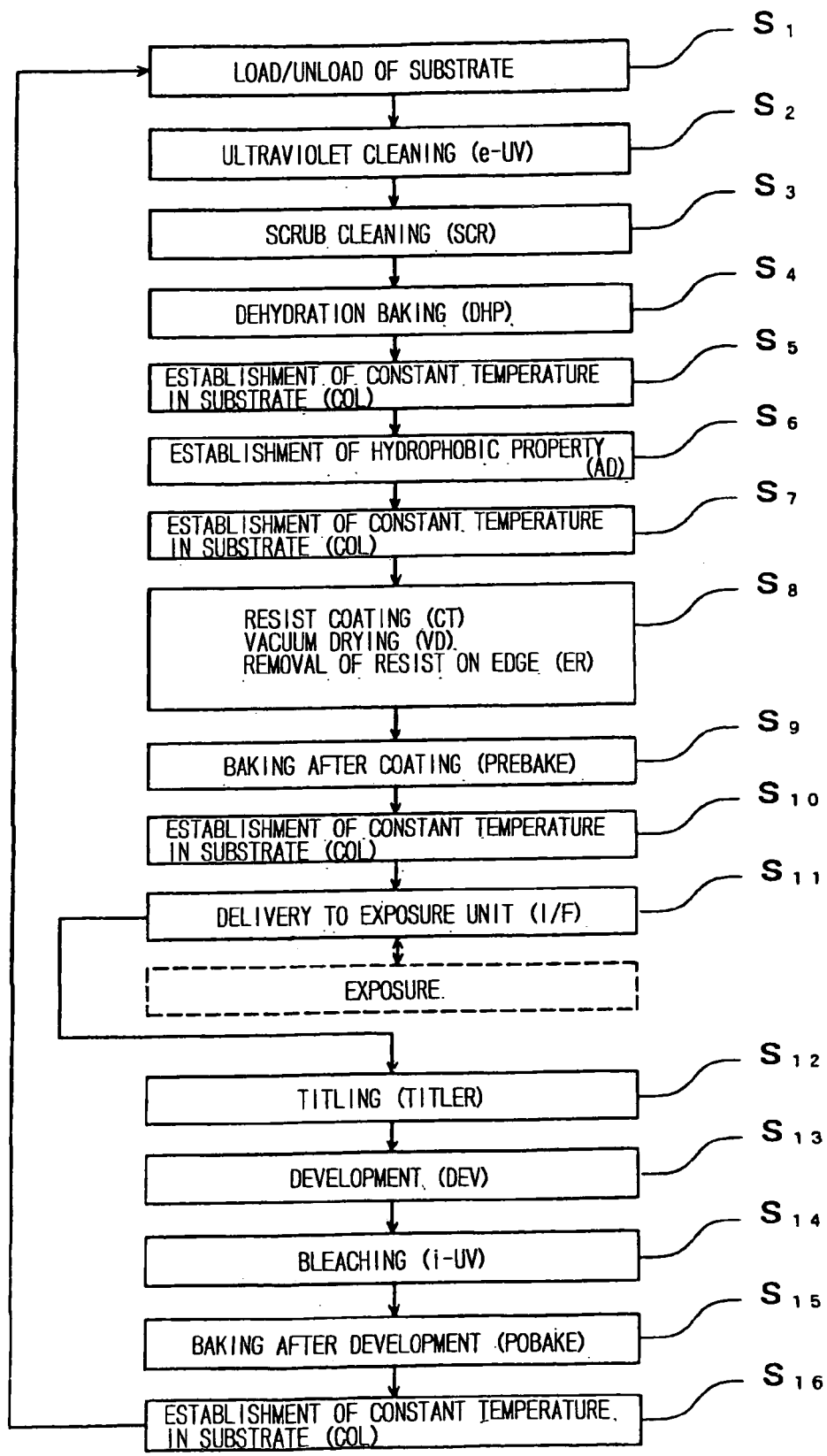
F I G. 3

DEVELOPING METHOD AND APPARATUS

BACKGROUND OF THE INVENTION

1. Technical Field of the Invention

This invention relates to developing method and apparatus in photo lithography. More particularly, the invention relates to a technique to recycle developing fluid (developer).

2. Description of the Related Art

In the photo lithography for manufacturing liquid crystal display (LCD) units and semiconductor devices, there are performed sequent processes of: applying photo resist on a substrate to be processed of a substrate (e.g. glass substrate, semiconductor wafer, etc.) at a resist coating process; baking a mask pattern on the photo resist at an exposure process; and allowing photosensitive parts and nonphotosensitive parts defined in the photo resist to dissolve in developing fluid at a developing process. In this way, a resist pattern is formed in the surface of the substrate.

In general, an alkaline solution is used as the developing fluid for the photo resist. In the manufacturing process for LCD disliking alkaline metals and semiconductor devices, particularly, a 2.38% tetramethyl-ammonium hydro-oxide (TMAH) solution as organic alkaline is used widely.

Conventionally, the developing apparatus employs a recycle system for circulating the developing fluid used at the developing process in order to save the consumption of developing fluid per substrate. This recycle system is disclosed in Japanese Unexamined Patent Publication (kokai) Nos. 8-45832 (pages 4–5, FIG. 2), 9-7939 (FIG. 4) and 10-321517 (pages 4–5, FIG. 2). In this kind of developer circulating recycle system, the TMAH concentration is returned to the standard value (2.38%) by either adding new liquid (i.e. 2.38% TMAH solution) to a developing fluid collected from a developing section or adding deionized (pure) water to a concentrate TMAH solution (e.g. 20% TMAH solution). Subsequently, the developing section is supplied with the resulting TMAH solution having the standard concentration (2.38%) as a recycled developing fluid.

In the conventional developer circulating recycle system to restore or maintain the TMAH concentration of the developing fluid to the standard value (2.38%) in the above way, however, there is a problem that if increasing the number of recycling the developing fluid, it becomes difficult to maintain the uniformity in development, especially, linewidth uniformity (CD uniformity). In detail, it is noted that the quantity of resist dissolving into the developing fluid increases with an increase in the number of recycling it. Therefore, even granting that the TMAH concentration is maintained to the standard concentration (2.38%), the weight ratio of solvent (water) in the developing fluid decreases as the quantity of resist or resist content increases. Additionally, it is also noted that a component of resist (resin) has a function to promote development. Combining the former reason with the latter reason, the developing rate is increased, so that the linewidth becomes easy to change into downward trend.

SUMMARY OF THE INVENTION

In the above situation, an object of the present invention is to provide developing method and apparatus that can make sure of the uniformity in development in spite of reusing the developing fluid in multiple times. Additionally, another object of the present invention is to provide developing method and apparatus that make it possible to save the consumption of developing fluid remarkably.

In order to attain the above objects to be solved, the first developing method of the present invention comprises the steps of: collecting an alkaline developing fluid which has been used in a development process against a resist film on a substrate to be processed; measuring a resist concentration of the developing fluid collected in the collecting step; calculating an alkaline concentration corresponding to a measured value of the resist concentration for realization of a uniformity in development; controlling the component of the developing fluid in order to accomplish the alkaline concentration calculated in the calculating step; and reusing the developing fluid as a result of controlling the component of the developing fluid, for the development process.

Additionally, the first developing apparatus of the present invention comprises: a processing part for performing a development process to dissolve an unnecessary portion in a photo resist film on a substrate to be processed, by an alkaline developing fluid; a collecting part for collecting the developing fluid used in the development process at the processing part; a resist-concentration measuring part for measuring a resist concentration of the developing fluid collected; an alkaline-concentration calculating part for calculating an alkaline concentration corresponding to a measured value of the resist concentration for realization of a uniformity in development; a developer blending part for controlling the component of the developing fluid in order to accomplish the alkaline concentration calculated; and a developer supply part for supplying the processing part with the developing fluid whose component has been controlled in the developer blending part, in order to reuse the developing fluid.

According to the first developing method and apparatus of the invention, when reusing the developing fluid, the component of the developing fluid is controlled so that the developing fluid has an alkaline concentration allowing the influence of resist component on the developing rate to be canceled corresponding to the resist concentration (measured value). Consequently, it is possible to make sure of the uniformity in development. Preferably, the resist concentration is measured by using an absorption photometry. In this case, if there is a limit in the measurement range of the resist concentration, it is preferable to obtain a diluted developing fluid by diluting the developing fluid with a predetermined solvent with a designated mixing ratio. Continuously, after measuring the resist concentration of the diluted developing fluid by using the absorption photometry, a measured value of the resist concentration of the diluted developing fluid may be converted to a measured value of the resist concentration of the developing fluid before diluting.

Further, in controlling the component of the developing fluid, preferably, it may be carried out to measure the alkaline concentration of the developing fluid and further add at least either one of a concentrate developing solution and a solvent into the developing fluid until a measured value of the alkaline concentration of the developing fluid accords with the calculated alkaline concentration. Regarding the first developing apparatus, preferably, the developer blending part comprises: a developer container for accommodating the developing fluid therein; a concentrate developer supplier for supplying the developer container with a concentrate developing solution; a solvent supplier for supplying the developer container with a solvent; a developer discharging unit for discharging the developing fluid from the developer container; an alkaline-concentration measuring unit for measuring an alkaline concentration of the developing fluid in the developer container; a control unit for controlling at least either one of the quantity of the developing fluid discharged from the developer container, the quantity of the concentrate developing solution supplied from the concentrate developer supplier into the developer container and the quantity of the solvent supplied from the solvent supplier into the developer container, so that a measured value of the alkaline concentration obtained by the alkaline-concentration measuring unit accords with the alkaline concentration calculated by the alkaline-concentration calculating part.

The second developing method of the present invention comprises the steps of: collecting an alkaline developing fluid which has been used in a development process against a photo resist film on a substrate to be processed; measuring an alkaline concentration of the developing fluid collected in the collecting step; calculating a resist concentration corresponding to a measured value of the alkaline concentration for realization of a uniformity in development; controlling the component of the developing fluid in order to accomplish the resist concentration calculated in the calculating step; and reusing the developing fluid as a result of controlling the component of the developing fluid, for the development process.

Further, the second developing apparatus of the present invention comprises: a processing part for performing a development process to dissolve an unnecessary portion in a photo resist film on a substrate to be processed, by an alkaline developing fluid; a collecting part for collecting the developing fluid used in the development process at the processing part; an alkaline-concentration measuring part for measuring an alkaline concentration of the developing fluid collected; a resist-concentration calculating part for calculating a resist concentration corresponding to a measured value of the alkaline concentration for realization of a uniformity in development; a developer blending part for controlling the component of the developing fluid in order to accomplish the resist concentration calculated; and a developer supply part for supplying the processing part with the developing fluid whose component has been controlled in the developer blending part, in order to reuse the developing fluid.

According to the second developing method and apparatus of the invention, when reusing the developing fluid, the component of the developing fluid is controlled so that the developing fluid has a resist concentration allowing the influence of resist component on the developing rate to be canceled corresponding to the alkaline concentration (measured value). Then, it is possible to make sure of the uniformity in development. Preferably, the alkaline concentration is measured by using a conductivity measuring method.

Further, in controlling the component of the developing fluid, preferably, it may be carried out to measure the resist concentration of the developing fluid and further add at least either one of a concentrate developing solution and a solvent into the developing fluid until a measured value of the resist concentration of the developing fluid accords with the calculated resist concentration. Regarding the second developing apparatus, preferably, the developer blending part comprises: a developer container for accommodating the developing fluid therein; a concentrate developer supplier for supplying the developer container with a concentrate developing solution; a solvent supplier for supplying the developer container with a solvent; a developer discharging unit for discharging the developing fluid from the developer container; a resist-concentration measuring unit for measuring a resist concentration of the developing fluid in the developer container; a control unit for controlling at least either one of the quantity of the developing fluid discharged from the developer container, the quantity of the concentrate developing solution supplied from the concentrate developer supplier into the developer container and the quantity of the solvent supplied from the solvent supplier into the developer container, so that a measured value of the resist concentration obtained by the resist-concentration measuring unit accords with the resist concentration calculated by the resist-concentration calculating part.

BRIEF DESCRIPTION OF THE DRAWINGS

FIG. 3 is a flow chart showing the procedure in the coating and developing system of FIG. 1;

DESCRIPTION OF THE PREFERRED EMBODIMENT

Referring to attached drawings, preferred embodiments will be described below.

Figure 1:
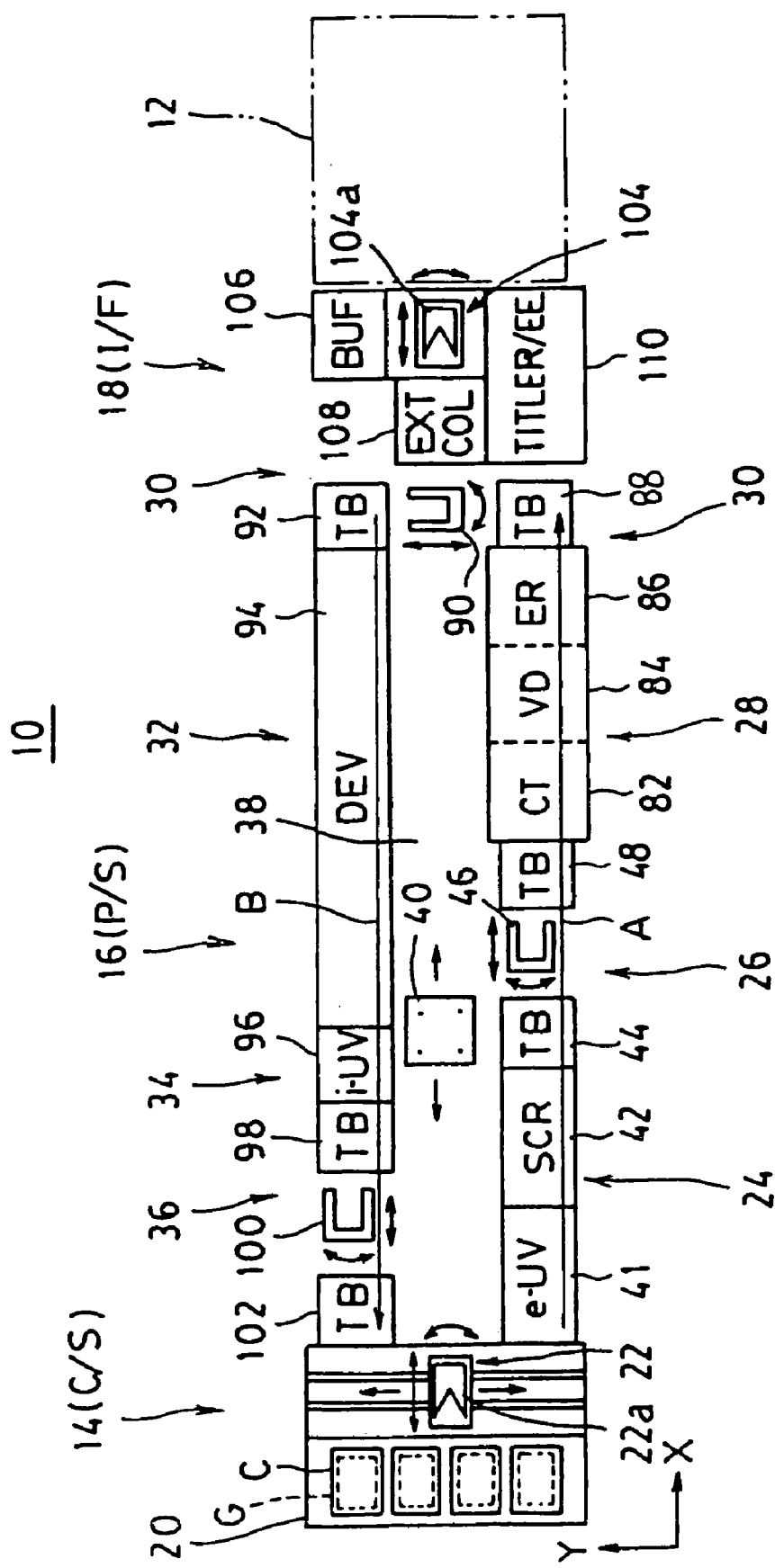
FIG. 1 is a plan view showing the constitution of a coating and developing system to which developing method and apparatus of the present invention are applicable.

FIG. 1 illustrates a coating and developing system as one structural example that the developing method and apparatus of the present invention are applicable. This coating and developing system 10 is arranged in a clean room (not shown). Providing that a substrate to be processed is a LCD substrate, the coating and developing system 10 performs various processes at a photo lithography process in the LCD manufacturing process, for example, cleaning, resist coating, pre-baking, developing and post-baking. Note, an exposure process is performed by an exposure unit 12 in abutment with the above coating and developing system 10.

The coating and developing system 10 has a horizontal process station (P/S) 16 arranged at the intermediate position of the system 10, a cassette station (C/S) 14 and an interface station (I/F) 18 arranged on both sides in the longitudinal direction (X-direction) of the system 10, respectively.

The cassette station (C/S) 14 forms a cassette loading/unloading port for the system 10 and also includes a cassette stage 20 capable of mounting four cassettes C (at the maximum) juxtaposed in one horizontal direction (e.g. Y-direction), the cassettes C each capable of accommodating a plurality of substrates G piled in multistage and a transfer mechanism 22 to take the substrates G in and out of the cassette C on the cassette stage 20. The transfer mechanism 22 has means for holding the substrate G, for example, a transfer arm 22a. The transfer arm 22a is movable along respective directions of four axes of X, Y, Z and θ, allowing the substrate G to be transferred to and from the adjoining process station (P/S) 16.

The process station (P/S) 16 has respective processing parts arranged along a pair of parallel and opposite lines A, B in the longitudinal (X–) direction of the system, in order of the processing flow or the manufacturing processes. More fully, there are arranged, in the upstream process line A from the cassette station (C/S) 14 to the interface station (I/F) 18, a cleaning section 24, a first thermal treatment section 26, a coating section 28 and a second thermal treatment section 30 in a horizontal line. On the other hand, there are arranged, in the downstream process line B from the interface station (I/F) 18 to the cassette station (C/S) 14, the second thermal treatment section 30, a developing section 32, a bleaching section 34 and a third thermal treatment section 36 in a horizontal line. According to this arrangement, the second thermal treatment section 30 is positioned at the rearmost end of the process line A on the upstream side and also positioned at the leading end of the process line B on the downstream side, lying across the process lines A, B.

An auxiliary transfer space 38 is defined between the process line A and the process line B, allowing a shuttle 40 for mounting the single substrate W thereon horizontally to be moved in both directions along the lines A, B (X) by a not-shown drive mechanism.

In the process line A on the upstream side of transportation, the cleaning section 24 includes a scrubber unit (SCR) 42 and an excimer (e-UV) irradiation unit 41 adjoining the cassette station (C/S) in the scrubber unit (SCR) 42. The scrubber unit (SCR) 42 has a cleaning part to perform brush cleaning or blow cleaning to the upper surface (surface to be processed) of the LCD substrate G while transporting it in its horizontal posture to the direction of the line A by means of rollers or belt.

Figure 2:
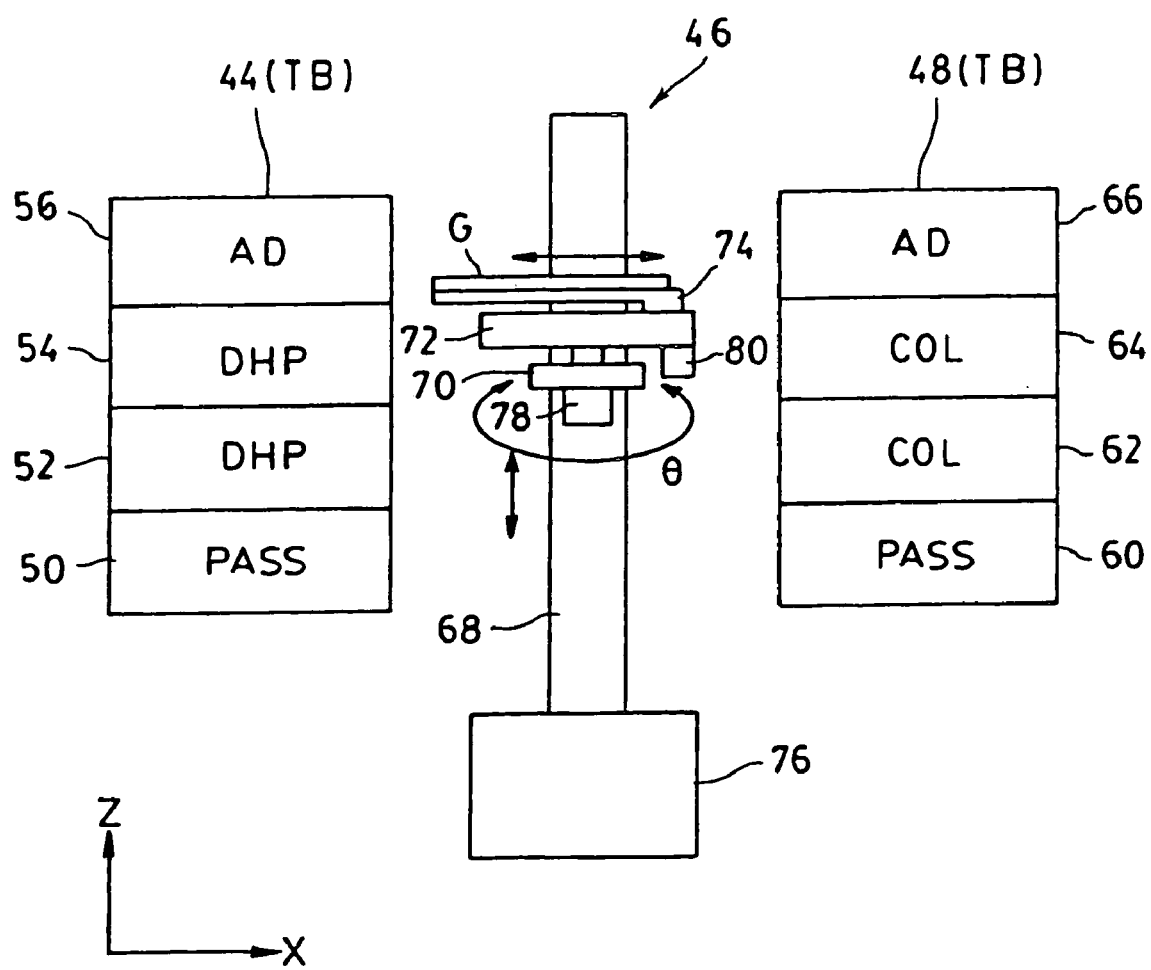
FIG. 2 is a side view showing the constitution of a first thermal treatment section in the coating and developing system of FIG. 1.

The first thermal treatment section 26 adjoining on the downstream side of the cleaning section 24 has a vertical transfer mechanism 46 at the center of the process line A. On each of to-and-fro sides of the transfer mechanism 46, there are a plurality of units being stacked up in multistage. For example, as shown in FIG. 2, a turnover booth (TB) 44 on the upstream side comprises a pass unit (PASS) 50 for delivering the substrate, dehydration-bake heating units (DHP) 52, 54 and an adhesion unit (AD) 56 that are stacked up in order from the bottom. Here, the pass unit (PASS) 50 is provided to transfer the substrate G to and from the scrubber unit (SCR) 42. On the other hand, another turnover booth (TB) 48 on the downstream side comprises a pass unit (PASS) 60 for delivering the substrate, cooling units (CL) 62, 64 and an adhesion unit (AD) 66 that are stacked up in order from the bottom. Here, the pass unit (PASS) 60 is provided to transfer the substrate G to and from the coating section 28.

As shown in FIG. 2, the transfer mechanism 46 includes an elevator body 70 movable up and down along a guide rail 68 extending in the vertical direction, a turning body 72 rotatable or pivotal in the direction θ and a transfer arm or pincette 74 movable back and forth or extendable while carrying the substrate G on the turning body 72. On the base side of the vertical guide rail 68, one driver unit 76 is arranged to move the elevator 70 up and down. Further, another driver unit 78 is attached to the elevator body 70 to rotate the turning body 72. A further driver unit 80 is attached to the turning body 72 to move the transfer arm 74 back and forth. These driver units 76, 78, 80 may be constructed by electric motors etc.

The above-constructed transfer mechanism 46 gives access to any unit in the turnover booths (TB) 44, 48 with elevating and rotating movements at high speed and further, the mechanism 46 can transfer the substrate G to and from the shuttle 40 in the auxiliary transfer space 38.

The coating section 28 adjoining on the downstream side of the first thermal treatment section 26 includes, as shown in FIG. 1, a resist coating unit (CT) 82, a vacuum drying unit (VD) 84 and an edge remover unit (ER) 86 that are arranged in a row along the process line A. In the coating section 28, there is provided a not-shown transfer unit that loads and unloads the substrates G to and from these three units (CT) 82, (VD) 84 and (ER) 86, one by one in the processing order, allowing the single substrate to be processed in each of the units (CT) 82, (VD) 84 and (ER) 86.

The second thermal treatment section 30 adjoining on the downstream side of the coating section 28 is similar in constitution to the first thermal treatment section 26. The second thermal treatment section 30 includes a vertical transfer mechanism 90 between the process line A and the process line B, one turnover booth (TB) 88 at the rearmost end of the process line A and another turnover booth 92 at the leading end of the process line B.

For example, although not shown in the figure, the turnover booth (TB) 88 in the process line A may comprise a substrate-delivery pass unit (PASS) on the lowermost stage and pre-bake heating units (PREBAKE) piled thereon in plural stages, for example, three stages. Similarly, the turnover booth (TB) 92 in the process line B may comprise a substrate-delivery pass unit (PASS) on the lowermost stage, a cooling unit (COL) piled thereon and pre-bake heating units (PREBAKE) piled on the cooling unit (COL), in plural stages, for example, two stages.

The transfer mechanism 90 in the second thermal treatment section 30 is constructed to not only allow the single substrate G to be transferred to and from the coating section 28 and the developing section 32 through the pass unit (PASS) of the turnover booths (TB) 82, 92 respectively but allowing the single substrate G to be transferred to and from the shuttle 40 in the space 38 and also the interface station (I/F) 18 mentioned later.

In the process line B on the downstream side of transportation, the developing section 32 includes a developing unit (DEV) 94 that performs a series of developing processes while transferring the substrate G in the horizontal posture. This developing unit (DEV) 94 may be called as "flat-feeding" type developing unit.

On the downstream side of the developing section 32, the third thermal treatment section 36 is arranged over the bleaching section 34. The bleaching section 34 includes an i-ray UV irradiation unit (i-UV) 96 that irradiates i-ray (wavelength: 365 nm) on the surface of the substrate G to be processed for bleaching it.

The third thermal treatment section 36 is similar in constitution to the first thermal treatment section 26 and the second thermal treatment section 30. Along the process line B, the third thermal treatment section 36 includes a vertical transfer mechanism 100 and a pair of turnover booths (TB) 98, 102 on both sides of the mechanism 100.

For example, although not shown in the figure, the turnover booth (TB) 98 on the upstream side may comprise a pass unit (PASS) on the lowermost stage and post-bake heating units (PROBAKE) piled thereon in plural stages, for example, three stages. Similarly, the turnover booth (TB)

102 on the downstream side may comprise a post baking unit (POBAKE) on the lowermost stage, a pass-cooling unit (PASS•COL) piled thereon to deliver and cool the substrate and post-bake heating units (POBAKE) piled on the pass-cooling units (PASS•COL) in two stages.

The transfer mechanism 100 in the third thermal treatment section 36 is constructed to not only allow the single substrate G to be transferred to and from the i-ray UV irradiation unit (i-UV) 96 and the cassette station (C/S) 14 through the pass unit (PASS) of the turnover booth (TB) 98, 102 and the pass-cooling unit (PASS•COL) of the turnover booth (TB) 102 respectively but allowing the single substrate G to be transferred to and from the shuttle 40 in the space 38.

The interface station (I/F) 18 includes a transfer unit 104 to transfer the substrate G to and from the adjoining exposure unit 12. Around the transfer unit 104, there are a buffer stage (BUF) 106, an extension cleaning stage (EXT•COL) 108 and a peripheral unit 110. The buffer stage (BUF) 106 has a stationary type buffer cassette (not shown). The extension cleaning stage (EXT•COL) 108, which is a stage equipped with cooling function to deliver the substrate, is utilized to transfer the substrate B to and from the process station (P/S) 16. The peripheral unit 110 may be formed by, for example, a titler unit (TITLER) and an edge exposure unit (EE) stacked up and down. The transfer unit 104 has transfer means enabling carrying of the substrate G, for example, a transfer arm 104a, allowing the substrate G to be transferred to and from the adjoining exposure unit 12 and the respective units (BUF) 106, (EXT•COL) 108 and (TITLER/EE) 110.

FIG. 3 shows the processing order in the coating and developing system. First of all, at the cassette station (C/S) 14, the transfer mechanism 22 picks up one substrate G from a specified cassette C on the stage 20 and further loads the substrate G into the excimer UV irradiation unit (e-UV) 41 of the cleaning section 24 in the process station (P/S) 16 (at step S1).

In the excimer UV irradiation unit (e-UV) 41, the substrate G is subjected to dry-cleaning by using irradiated ultraviolet rays (at step S2). Due to this ultraviolet cleaning, organic substances are removed from the substrate G mainly. After completing the ultraviolet cleaning, the substrate G is transferred to the scrubber unit (SCR) 42 of the cleaning section 24 by the transfer mechanism 22 of the cassette station (C/S) 14.

In the scrubber unit (SCR) 42, as mentioned before, it is performed to apply brush cleaning or blow cleaning to the upper surface (surface to be processed) of the substrate G while transporting (flat-feeding) it in the horizontal posture to the direction of the line A by means of rollers or belt. Consequently, granular stains are removed from the surface of the substrate G (at step S3). After cleaning, the scrubber unit (SCR) 42 applies a rinsing process to the substrate G while transferring it in the horizontal posture and finally dries the substrate G by means of "air-knife" etc.

On completion of the cleaning process in the scrubber unit (SCR) 42, the substrate G is then loaded into the pass unit (PASS) 50 in the turnover booth (TB) 44 on the upstream side of the first thermal treatment section 26.

In the first thermal treatment section 26, the transfer mechanism 46 transfers the substrate G so as to pass designated units in accordance with a predetermined sequence. For example, the substrate G is first transported from the pass unit (PASS) 50 to either the heating unit (DHP) 52 or the heating unit (DHP) 54 where the dehydration process is applied (at step S4). Next, the substrate G is shifted to either of the cooling units (COL) 62, 64 where the substrate G is cooled down to a constant temperature (at step S5). Subsequently, the substrate G is transferred to the adhesion unit (AD) 56 carrying out a hydrophobic process (at step S6). After completing the hydrophobic process, the substrate G is cooled down to a constant temperature by either of the cooling units (COL) 62, 64 (at step S7). Finally, the substrate G is moved to the pass unit (PASS) 60 belonging to the turnover booth (TB) 48 on the downstream side.

In this way, the first thermal treatment section 26 allows the substrate G to come and go between the turnover booth (TB) 44 on the upstream side and the turnover booth (TB) 48 on the downstream side by the transfer mechanism 46 optionally. Note, the second and third thermal treatment sections 30, 36 are also adapted so as to perform the similar transfer operation to above.

The substrate G, which has been subjected to the above-mentioned successive thermal or heat treatment in the first thermal treatment section 26, is transported from the pass unit (PASS) 60 in the turnover booth (TB) 48 on the downstream side to the adjoining resist coating unit (CT) 82 of the coating section 28 on the downstream side of the turnover booth (TB) 48.

At the resist coating unit (CT) 82, the substrate G is coated, on its upper surface (i.e. surface to be processed), with resist liquid by e.g. spin coating method and immediately thereafter, the coated substrate G is subjected to drying process at the vacuum drying unit (VD) 84 adjoining on the downstream side of the unit (CT) 82. Next, superfluous and unnecessary resist on the periphery of the substrate G is removed therefrom at the edge remover unit (ER) 86 adjoining on the downstream side of the unit (VD) 84 (at step S8).

After the above-mentioned resist coating process, the substrate G is delivered from the edge remover unit (ER) 86 to the pass unit (PASS) belonging to the turnover booth (TB) 88 on the upstream side of the second thermal treatment section 30.

In the second thermal treatment section 30, the transfer mechanism 90 transfers the substrate G so as to pass designated units in accordance with a predetermined sequence. For example, the substrate G is first transported from the above pass unit (PASS) to one pre-baking heating unit (PREBAKE) where the baking process after resist coating is applied (at step S9). Next, the substrate G is shifted to one cooling unit (COL) where the substrate G is cooled down to a constant temperature (at step S10). Subsequently, the substrate G is delivered to the extension cooling stage (EXT•COL) 108 in the interface station (I/F) 18 through the intermediary of the pass unit (PASS) of the turnover booth (TB) 92 on the downstream side or no intermediary.

In the interface station (I/F) 18, the substrate G is transferred from the extension cooling stage (EXT•COL) 108 to the edge exposure unit (EE) of the peripheral unit 110 where the substrate G is subjected to exposure to remove resist adhering to the periphery of the substrate G at developing and thereafter, it is fed to the adjoining exposure unit 12 (at step S11).

At the exposure unit 12, a designated circuit pattern is exposed on the resist on the substrate G. The substrate G on completion of pattern exposure is returned from the exposure unit 12 to the interface station (I/F) 19 (at step S11). In the interface station (I/F) 19, the substrate G is loaded into the titler (TITLER) of the peripheral unit 110 where predetermined information is entered to a predetermined position (at step S12). Thereafter, the substrate G is returned to the extension cooling stage (EXT•COL) 108. The transportation of the substrate G in the interface station (I/F) 18 and the transfer of the substrate G to and from the exposure unit 12 are carried out by the transfer unit 104.

At the second thermal treatment section 30 in the process station (P/S) 16, the transfer mechanism 90 receives the exposed substrate G from the extension cooling stage (EXT•COL) 108 and delivers the substrate G to the developing section 32 via the pass unit (PASS) in the turnover booth (TB) 92 in the process line B.

In the developing section 32, the substrate G brought from the pass unit (PASS) in the turnover booth (TB) 92 is loaded into the developing unit (DEV) 94. In the developing unit (DEV) 94, the substrate G is transferred to the downstream side of the process line B in the so-called "flat-feeding" manner. During this transportation, a series of developing processes (developing, rinsing and drying) are performed (at step S13).

The substrate G after development at the developing section 32 is loaded into the bleaching section 34 adjoining on the downstream side of the section 32, wherein the substrate G is subjected to a bleaching process using i-ray irradiation (at step S14). The substrate G after the bleaching process is delivered to the pass unit (PASS) in the turnover booth (TB) 98 on the upstream side of the third thermal treatment section 36.

In the third thermal treatment section 36, the substrate G is first shifted from the pass unit (PASS) to one heating unit (POBAKE) where the substrate G is subjected to post baking (at step S15). Next, the substrate G is moved to the pass cooling unit (PASS•COL) in the turnover booth (TB) 102 on the downstream side of the section 36. In the pass cooling unit (PASS•COL), the substrate G is cooled down to a predetermined temperature (at step S16). In the third thermal treatment section 36, the substrate G is transported by the transfer mechanism 100.

In the cassette station (C/S) 14, the transfer mechanism 22 receives the substrate G completing the whole steps of the coating and developing processes from the pass cooling unit (PASS•COL) in the third thermal treatment section 36 and further accommodates the so-received substrate G in any one of the cassettes C (at step S1).

In the above-mentioned coating and developing system 10, the present invention is applicable to the developing unit (DEV) 94 of the developing section 32. Referring to FIGS. 4 to 8, we now describe one embodiment where the present invention is applied to the developing unit (DEV) 94.

Figure 4:
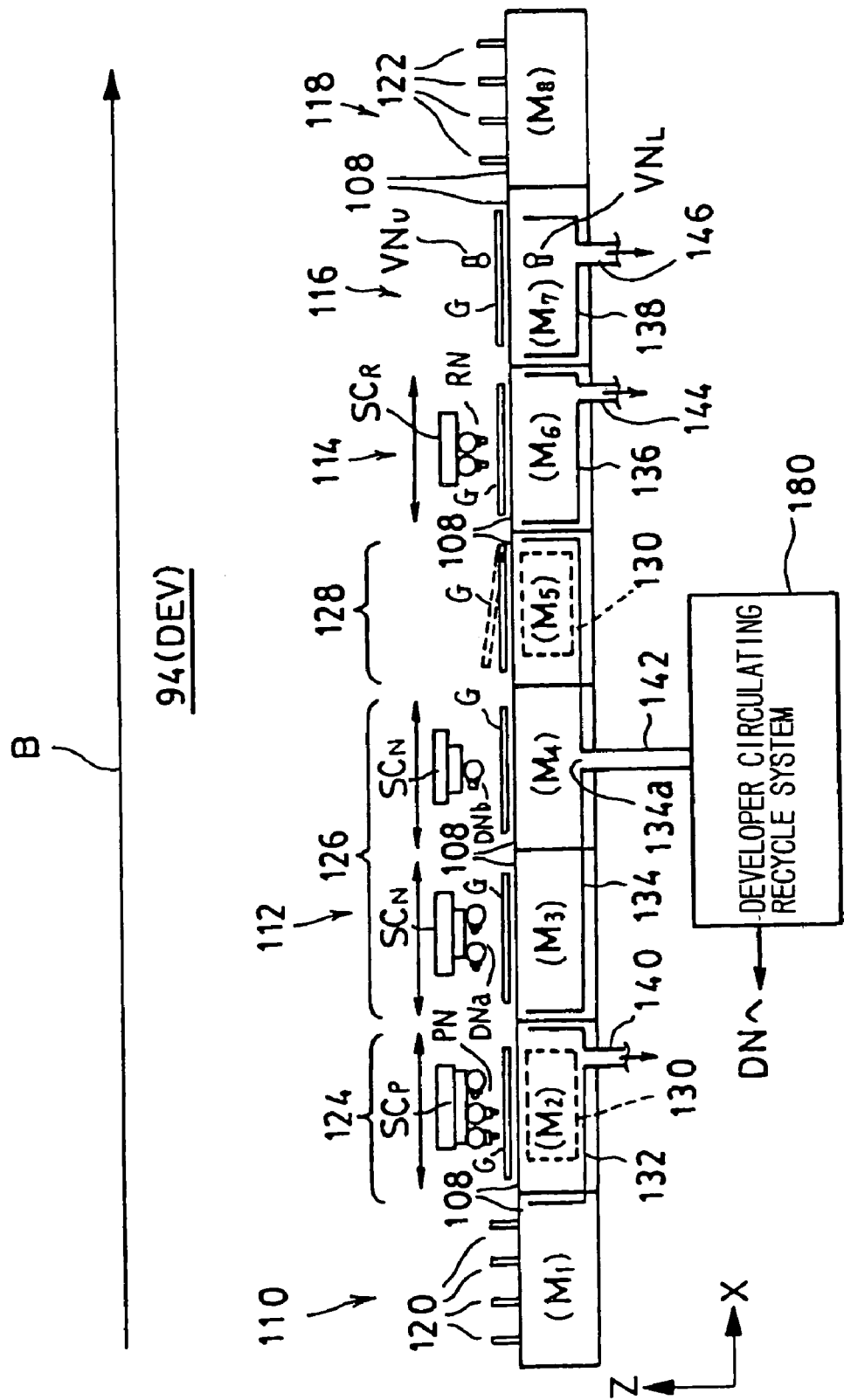
FIG. 4 is a side view showing the whole constitution of a developing unit in accordance with an embodiment of the present invention.

FIG. 4 illustrates the whole constitution of the developing unit (DEV) 94 in accordance with the embodiment of the invention typically. The developing unit (DEV) 94 comprises a plurality of (e.g. eight) modules M1 to M8 successively arranged in a line to form a continuous transfer path 108 extending in the horizontal (X) direction along the process line B.

In these modules M1 to M8, the module M1 at the upstream end forms a substrate loading part 110, the sequent (four) modules M2, M3, M4 and MS form a developing part 112, the next module M6 forms a rinsing part 114, the next module M7 forms a drying part 116, and the backmost module M8 forms a substrate unloading part 118.

The substrate loading part 110 is provided with a plurality of elevator lift pins 120 that receive the substrate G, which has been delivered from the adjoining substrate transfer mechanism (not shown), in the horizontal posture in order to mount the substrate G on the transfer path 108. Similarly, the substrate unloading part 118 is provided with a plurality of elevator lift pins 122 that lift up the substrate G in the horizontal posture in order to deliver it to the adjoining substrate transfer mechanism (not shown).

In the developing part 112, for more detail, a pre-wet part 124 is arranged in the module M2, a developing part 126 in the modules M3 and M4, and a developer drop part 128 is arranged in the module M5. The pre-wet part 124 is provided with one or more pre-wet liquid nozzles PN to supply pre-wet liquid or pure (deionized) water to the substrate. The pre-wet liquid nozzle(s) PN has a nozzle orifice facing the transfer path 108 and is movable in both directions along the transfer path 108. The developing part 126 is provided with one or more developer nozzles DN each of which has a nozzle orifice facing the transfer path 108 and is movable in both directions along the transfer path 108. In this embodiment, there are provided, for the modules M3, M4, developer nozzles Dna, Dnb movable independently of each other, respectively. The respective developer nozzles DN are supplied with developer (developing fluid) from a developer circulating recycle system 180. Substrate inclining mechanisms 130 are respectively arranged in the developer drop part 128 and the pre-wet part 124 to incline the substrate G.

The rinsing part 114 is provided with one or more rinsing liquid nozzles RN to supply rinsing liquid or pure (deionized) water to the substrate. The rinsing liquid nozzle(s) RN has a nozzle orifice facing the transfer path 108 and is movable in both directions along the transfer path 108.

In the drying part 116, one or more pairs of vapor knives (VN) are arranged along the transfer path 108, for blowing away liquid adhering to the substrate G, mainly rinsing liquid. The vapor knives (VN) in pairs are arranged so as to interpose the transfer path 108 therebetween.

In the developing part 112, the rinsing part 114 and the drying part 116, respective pans 132, 134, 136, 138 are arranged to receiving the liquid falling below the transfer path 108. In the developing part 112, for more detail, the pan 132 is provided for the pre-wet part 124 exclusively, while the pan 134 is provided for the developing part 126 and the developer drop part 128 exclusively. The pans 132, 134, 136, 138 are provided, on respective bottoms thereof, with respective drain ports which are connected to drain pipes 140, 142, 144, 146, respectively. In these drain pipes, the drain pipe 142 is communicated with the developer circulating recycle system 180.

In the transfer path 108, transfer roller 182 (FIG. 6) are arranged at regular intervals along the process line B. The rollers 182 allow the substrate G to be mounted thereon substantially horizontally. The transfer roller 182 are rotated by an electric motor (not shown) through a transmission mechanism (not shown), allowing the substrate G to be transferred from the module M1 to the module M8 in the horizontal direction.

In FIG. 4, the pre-wet liquid nozzle(s) PN, the developer nozzles DNa, DNb and the rinsing liquid nozzle(s) RN are respectively adapted so as to move above the transfer path 108 in parallel, by respective nozzle scanning mechanisms $SC_P$, $SC_N$ and $SC_R$.

Figure 5:
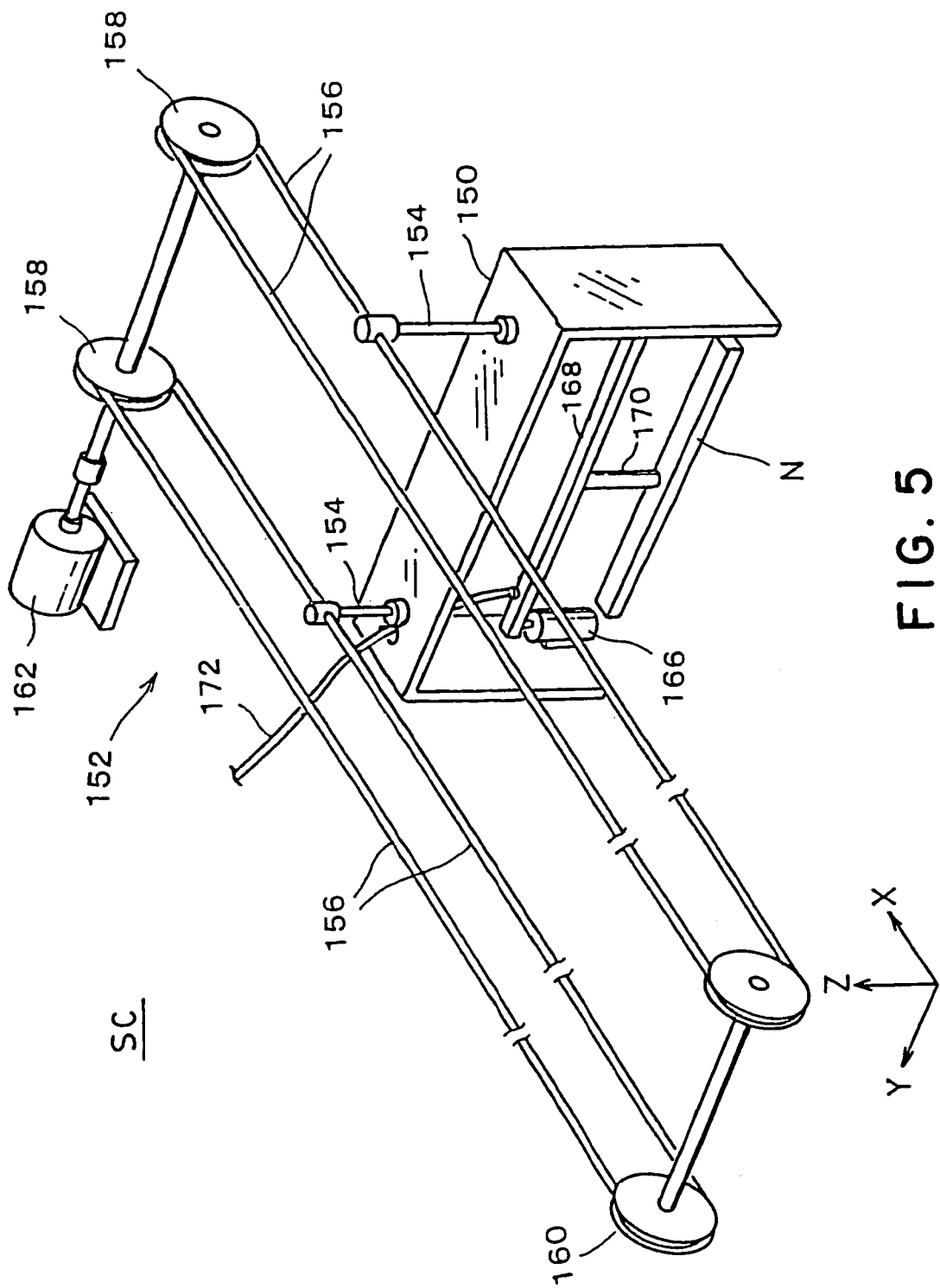
FIG. 5 is a perspective view showing a constituent example of a nozzle scanning mechanism in accordance with the embodiment of the present invention.

FIG. 5 shows one structural example of the nozzle scanning mechanism SC ($SC_P$, $SC_N$, $SC_R$). This nozzle scanning mechanism SC includes a nozzle transporter 150 shaped to have a reverse-U section for supporting the movable nozzle N (PN, DNa, DNb, RN), guide rails (not shown) for guiding the nozzle transporter 150 above and in parallel with the transfer path 108 and a scan driver 152 for driving the nozzle transporter 150 so as to move along the guide rails.

In the scan driver 152, one or more endless belts 156 are connected to the nozzle transporter 150 through one or more vertical support members 154. Being parallel to the guide rails (i.e. the transfer path 108), each endless belt 156 is wound around a drive pulley 156 and an idle pulley 160. The drive pulley 158 is operatively connected with a rotating shaft of an electric motor 162. The rotating force of the electric motor 162 is converted to a translatory movement of the nozzle transporter 150 in the longitudinal (X–) direction of the endless belt 156 through the pulleys 158, 160 and the belt 156. By controlling the rotating speed of the electric motor 162, the translatory moving speed of the transporter 150 is controlled to a predetermined value. By changing the rotating direction of the electric motor 162, the translatory moving direction of the transporter 150 can be changed.

In the nozzle transporter 150, elevator driving units 166 are attached to inner walls on both sides of the transporter 150 respectively. The elevator driving units 166 are formed by actuators, such as air cylinders. Between the elevator driving units 166 in left and right pairs, a horizontal beam 168 consisting of a hollow pipe is arranged to extend horizontally. A vertical beam 170 of a hollow pipe is suspended from the center of the horizontal beam 168 downward. A cylindrical movable nozzle N is horizontally attached to the lowermost end of the vertical beam 170 while directing its ejection orifices downward. In order to uniformly supply processing liquid to the substrate G within the range from its end up to the other end in the width direction of the transfer path 108, the above ejection orifices may be formed by through-holes at regular intervals in the longitudinal direction of the nozzle N. Alternatively, the ejection orifices may be formed by one or more slits.

In the nozzle transporter 150, owing to the elevating operation of the elevator driving units 166, the movable nozzle N is capable of hoisting through the horizontal beam 168 and the vertical beam 170, allowing moving up and down between a level to eject the processing liquid to the substrate G on the transfer path 108 and another level to collect from the transfer path 108 during no ejection of the processing liquid. A flexible processing-liquid supply pipe 172 is led from a liquid source (the developer circulating recycle system 180 in case of developer) outside the transfer path 108 into an end of the horizontal beam 168. The processing-liquid supply pipe 172 is connected to a liquid introductory port of the nozzle N through the inside of the horizontal beam 168 and that of the vertical beam 170.

Next, the whole operation of the developing unit (DEV) 94 will be described. The substrate loading part 110 receives the substrates G one by one from the adjoining substrate transfer mechanism (not shown) and further transfers them to the transfer path 108. As mentioned above, since rollers 182 (FIG. 6) defining the transfer path 108 are rotated by the electric motor through the transmission mechanism, the substrates G on the transfer path 108 are transferred to the adjoining developing part 102 immediately and successively.

In the developing part 112, the substrate G is loaded into the pre-wet part 124 at first. During transportation of the substrate G by means of rollers, the pre-wet liquid nozzles PN spray the pre-wet liquid, such as pure water, on the substrate G. In this embodiment, the pre-wet liquid is sprayed against the upper surface (the surface to be processed) of the moving substrate G while the nozzles PN are moving along the transfer path 108 horizontally due to the scan drive of the nozzle scanning mechanism $SC_P$ described with FIG. 5. The pre-wet liquid spattering out of the substrate G after hitting or the pre-wet liquid without hitting against the substrate G is gathered into the pre-wet liquid pan 132 below the transfer path 108.

Supposing the scanning direction of the nozzles PN to eject the pre-wet liquid against the substrate G on the transfer path 108 is established in opposition to the transferring direction of the substrate G, it means that each nozzle PN scans from the front end of the substrate G to the rear end at a relative speed $(v_N+v_G)$ as a result of adding a nozzle scanning speed $v_N$ to a substrate transfer speed $v_G$. In such a case, even if the substrate G is large-sized, it is possible to bedew the whole surface (resist surface) to be processed of the substrate G with the pre-wet liquid in a remarkable short time.

When the substrate G reaches a designated position on the downstream side in the pre-wet part 124, the substrate inclining mechanism 130 operates to lift up the substrate G above the transfer path 108 and inclines the substrate G rearward. Due to this inclination of the substrate G, the residual or adhering pre-wet liquid on the substrate G falls behind it mostly and is collected by the pre-wet liquid pan 132.

The substrate G on completion of the above pre-wet processing at the pre-wet part 124 is load into the developing part 126 through the transfer path 108. In the developing part 126, the developing fluid is sprayed against the substrate G by the developer nozzles DNa during passing through the first module M3 and further sprayed by the developer nozzles DNb during sequent passing through module M4, as well. These developer nozzles DNa, DNb spray the developing fluid against the upper surface (the surface to be processed) of the moving substrate G while moving above and along the transfer path 108 horizontally due to the scan drive of the nozzle scanning mechanism $SC_N$ described with FIG. 5. The liquid falling out of the substrate G as a result of spraying the developing fluid is then gathered into the developer pan 134 below the transfer path 108.

Similarly to the pre-wet part 124 mentioned above, it may be established in the developing part 126 that the scanning direction of the nozzles DN to eject the developing fluid against the substrate G on the transfer path 108 is opposed to the transferring direction of the substrate G. Consequently, each nozzle DN scans from the front end of the substrate G to the rear end at a relative speed $(v_N+v_G)$ as a result of adding a nozzle scanning speed $v_N$ to a substrate transfer speed $v_G$. In such a case, even if the substrate G is large-sized, it is possible to bedew the whole surface (resist surface) to be processed of the substrate G with the developing fluid in a remarkable short time. Note, the above-mentioned "spray" type developer supply may be replaced with so-called "paddle" type developer supply. Then, the spray type developer nozzles DNa, DNb are exchanged by liquid-banking type projecting nozzles. In the "paddle type" developer supply, the pre-wet part 124 is dispensable.

In this embodiment, since the modules M3, M4 are provided with the individual developer nozzles DNa, DNb and the individual nozzle scanning mechanisms $SC_N$, it is possible to supply the substrate G on the transfer path 108 with the developing fluid at temporal and spatial intervals in plural times. Additionally, it is also possible to alter the characteristics of the developing fluid between the first supply and the second supply.

The substrate G, which has been supplied with the developing fluid at the developing part 126 in the above way, is loaded into the developer drop part 128 while being still mounted on the transfer path 108. When the substrate G reaches a designated position on the downstream side in the developer drop part 128, the substrate inclining mechanism 130 operates to lift up the substrate G above the transfer path 108 and inclines the substrate G forward in the transferring direction, namely, in a manner that the upper side of the substrate G directs the developing part 126 obliquely. Due to this inclination of the substrate G, most of the developing fluid mounted on the substrate G falls ahead of it and is collected by the developer pan 134. In this way, as the substrate G is inclined so that its upside directs the previous developing part 126, it is possible to reduce a possibility that the liquid bouncing off the developer pan 134 adheres to the substrate G on the side of the developing part 126 when removing the liquid from the substrate G in the developer drop part 128. The developing fluid collected in the developer pan 134 is transported from a drain port 134a at the bottom of the pan 134 to the developer circulating recycle system 180 via the drain pipe 142.

On completion of the supply and collection of the developing fluid at the developing part 112, the substrate G is loaded into the rinsing part 114 through the transfer path 108. In the rinsing part 114, the rinsing liquid nozzles RN spray the rinsing liquid, such as pure water, against the upper surface (the surface to be processed) of the moving substrate G while moving above and along the transfer path 108 horizontally due to the scan drive of the nozzle scanning mechanism $SC_R$ described with FIG. 5. The rinsing liquid falling out of the substrate G is then gathered into the rinsing liquid pan 134 below the transfer path 108.

In the rinsing part 114 as well, it may be established that the scanning direction of the nozzles RN to eject the rinsing liquid against the substrate G on the transfer path 108 is opposed to the transferring direction of the substrate G. Consequently, each nozzle RN scans from the front end of the substrate G to the rear end at a relative speed ($v_N+v_G$) as a result of adding a nozzle scanning speed $v_N$ to a substrate transfer speed $v_G$. In such a case, even if the substrate G is large-sized, it is possible to supply the whole surface (resist surface) to be processed of the substrate G with the rinsing liquid in a remarkable short time, allowing a replacement of developer by the rinsing liquid (stop of development) immediately. Note, one or more rinsing liquid nozzles (not shown) for rinsing the back surface of the substrate G may be arranged below the transfer path 108.

After completing the above-mentioned rinsing process in the rinsing part 114, the substrate G is loaded into the drying part 116 through the transfer path 108. In the drying part 116, the upper and lower vapor knives $VN_U$, $VN_L$ in designated positions against the substrate G blow knife-shaped keen vapor currents against both upper surface (to be processed) and back surface of the substrate G to brush liquid adhering to the substrate G (mainly, rinsing liquid) behind it.

After the removal of the liquid at the drying part 116, the substrate G is loaded into the substrate unloading part 118 while being still mounted on the transfer path 108. The substrate unloading part 118 is similar in structure to the substrate loading part 110 and therefore, the former operates similarly to the latter with the exception that the unloading direction of the substrate G is opposite to the loading direction. That is, the substrate unloading part 118 waits for the substrate G being transferred from the upstream side (i.e. the drying part 116) while making the lift pins 122 stand ready in respective positions lower than the transfer path 108. When the substrate G reaches a predetermined position just above the lift pins 122, the substrate unloading part 118 operates to thrust up the pins 122 to raise the substrate G in the horizontal posture and further delivers it to the adjoining substrate transfer mechanism (not shown).

This developing unit (DEV) 94 is constructed so as to successively perform respective treatments at the pre-wet part 124, the developing part 126, the developer drop part 128, the rinsing part 114 and the drying part 116 while transferring a number of substrates G in a line, at predetermined intervals on the transfer path 108. Namely, owing to the adoption of so-called "pipeline" feeding system, it is possible to realize the development with high efficiency and throughput.

Figure 6:
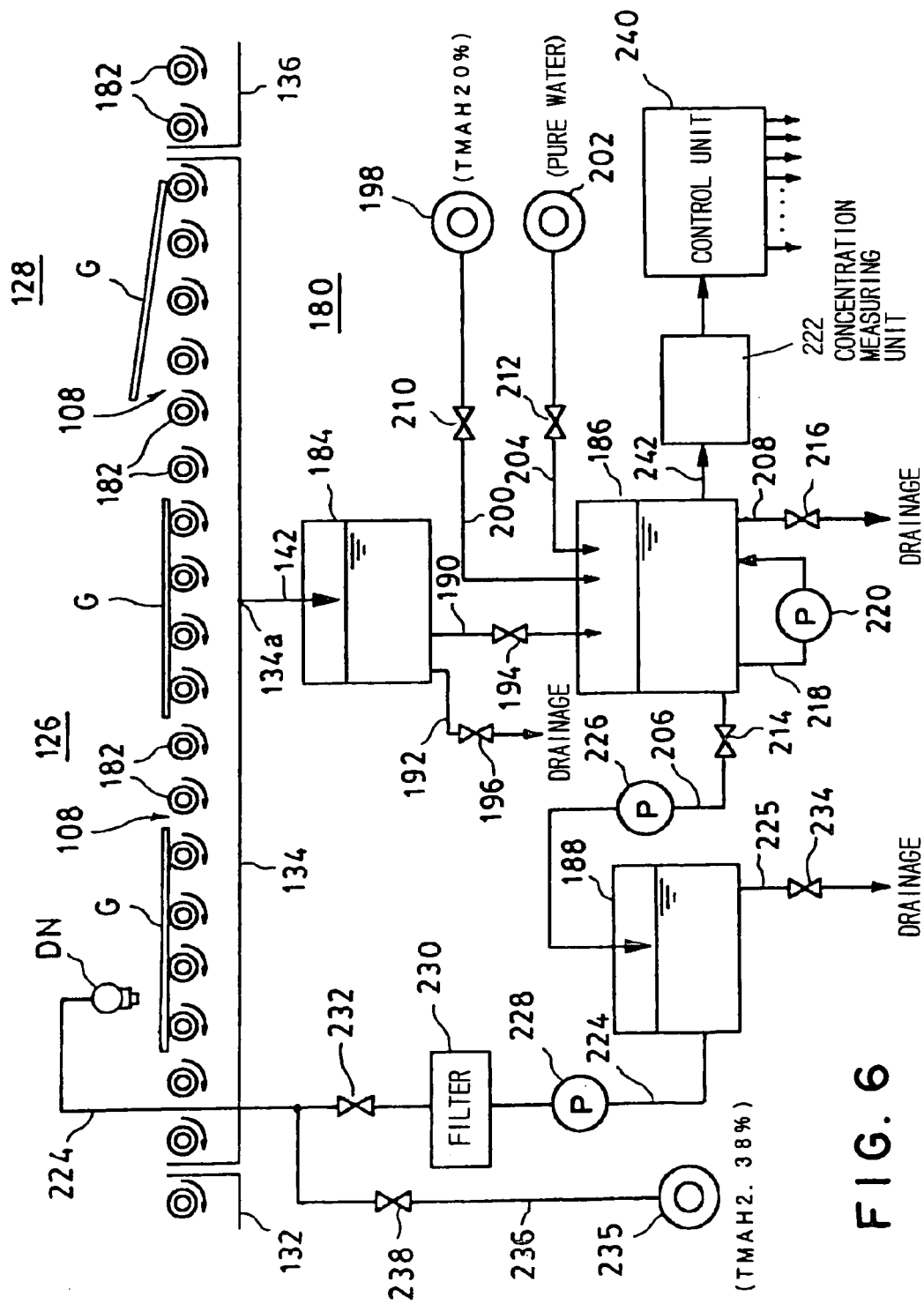
FIG. 6 is a block diagram showing the whole constitution of a developer circulating recycle system in accordance with the embodiment of the present invention.
Figure 7:
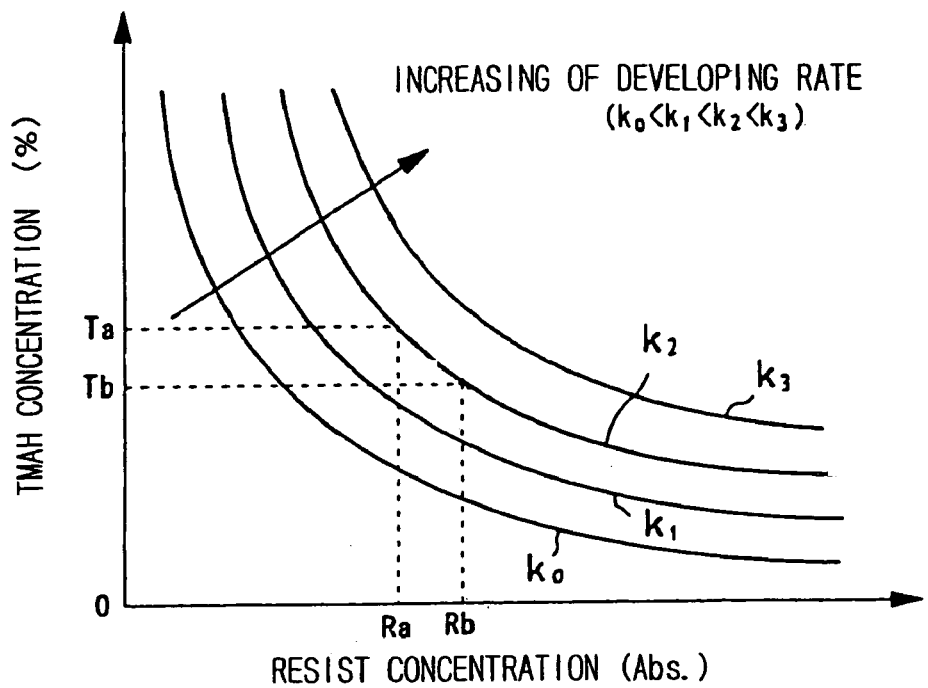
FIG. 7 is a diagram showing the relationship between resist concentration and TMAH concentration in order to maintain a constant developing rate in the embodiment of the present invention.

Referring to FIGS. 6 and 7, we now describe the constitution of the developer circulating recycle system 180. As shown in FIG. 6, the developer circulating recycle system 180 includes, for example, three developer containers, that is, a collect tank 184, a blending tank 186 and a supply tank 188.

The collect tank 184 is a container to reserve the developing fluid collected from the developing part 126 and the developer drop part 128, temporarily. Connected to the collect tank 184 are the drain pipe 142 extending from the developer pan 134, a transfer pipe 190 communicated with the blending tank 186 and a drain pipe 192 in communication with a drain tank (not shown). Respective valves 194, 196 are interposed in the transfer pipe 190 and the drain pipe 192, respectively.

The blending tank 186 is a container to adjust an alkaline concentration (i.e. TMAH concentration) of the collected developing fluid to a new concentration for the next-coming reusing. To this blending tank 186, there are connected the transfer pipe 190 from the collect tank 184, a concentrate TMAH solution pipe 200 from a concentrate TMAH solution source 198, a solvent pipe 204 from a solvent source 202, a transfer pipe 206 in communication with the supply tank 188 and a drain pipe 208 in communication with the drain tank (not shown). Respective valves 210, 212, 214, 216 are interposed in the concentrate TMAH solution pipe 200, the solvent pipe 204, the transfer pipe 206 and the drain pipe 208, respectively. Further, a circulation pipe 218 interposing a pump 220 is connected to the blending tank 186 in order to stir the developing fluid therein. Additionally, a concentration measuring unit 222 is also connected to the blending tank 186 in order to measure both resist concentration and alkaline concentration of the developing fluid in the tank.

The supply tank 188 is a container to reserve the developing fluid having the TMAH concentration controlled in the blending tank 186 temporarily in advance of supplying the same fluid to the developer nozzles DN of the developing part 126. A transfer pipe 206 from the blending tank 186, a developer supply pipe 224 in communication with the developer nozzles DN and a drain pipe 226 in communication with the drain tank (not shown) are respectively connected to the supply tank 188. Besides the valve 214, a pump 226 may be interposed in the transfer pipe 206. A pump 228, a filter 230 and a valve 232 are respectively interposed in the developer supply pipe 224. As occasion demands, the developer supply pipe 224 may include a pressure regulating valve, a flow control valve (not shown) or the like. A valve 234 is interposed in the drain pipe 225. The developer supply pipe 224 is connected, at a position on the downstream side of the valve 232, with a new TMAH solution pipe 236 extending from a new TMAH solution source 235. A valve 238 is interposed in the is connected to the new TMAH solution pipe 236.

The concentration measuring unit 222 picks the developing fluid in the blending tank 186 through a monitoring pipe to detect both resist concentration and alkaline concentration of the developing fluid. The measurement of the resist concentration is performed by using an absorption photometry, for example. While, the measurement of the alkaline concentration is performed by using a conductivity measuring method, for example.

A control unit 240 includes a microcomputer to control the operations of constituents of the system 180, particularly, the above valves (194, 196, 210, 212, 214, 216, 232, 238), the pumps (220, 226, 228) and so on. Additionally, the control unit 240 includes means for calculating an alkaline concentration of the developing fluid in the blending tank 186 for the next reusing, based on a measured value of the resist concentration detected by the concentration measuring unit 222. As the alkaline-concentration calculating means, the control unit 240 retains a data base describing a relationship or function between the resist concentration and the TMAH concentration in order to maintain a constant developing rate. For instance, the data base is in the form of a look-up table as shown in FIG. 7. For example, if a certain resist concentration Ra is given on the assumption that it is required to maintain a developing rate K2 (constant value) of FIG. 7, then it is possible to calculate a TMAH concentration Ta corresponding to the resist concentration Ra with reference to the look-up table. Similarly, if another resist concentration Rb is given, then it is possible to calculate a TMAH concentration Tb corresponding to the resist concentration Rb with reference to the look-up table. Referring to characteristic curves shown in FIG. 7, it will be understood that even if the resist concentration is increased from Ra to Rb, a desired developing rate K (constant value) can be maintained by the adjustment of decreasing the TMAH concentration from Ta to Tb. This look-up table can be built on a memory on the ground of experimental data.

Next, the operation of the developer circulating recycle system 180 will be described below. As mentioned above, at the developing part 126, the developing fluid falls from the periphery of the substrate G and is collected by the developer pan 134. While, at the developer drop part 128, the developing fluid falls from the whole substrate G due to the inclination of the substrate G and is collected by the developer pan 134.

The developing fluid gathered to the developer pan 134 is gathered from the drain port 134a at the bottom of the pan 134 into the collect tank 134 through the drain pipe 142. The quantity of developing fluid accumulated in the collect tank 184 increases as the number of development times, in other words, the number of processed substrates G does increase. Under the control of the control unit 240, the valve 194 is opened whenever the number of processed substrates G reaches a predetermined value, so that the collected developing fluid in the collect tank 184 is transferred to the blending tank 186 through the transfer pipe 194. Note, it is desirable to make the blending tank 186 empty in advance of the above transfer of the developing fluid.

After transferring the developing fluid from the collect tank 184 to the blending tank 186, the valve 194 is closed. On the other hand, the concentration measuring unit 222 picks part of the developing fluid in the blending tank 186. Further, the concentration measuring unit 222 measures the resist concentration by the absorption photometry and transmits the detection result of resist concentration to the control unit 240. Then, the control unit 240 on receipt of the measured value from the concentration measuring unit 222 calculates a TMAH concentration corresponding to the resist concentration in order to maintain a predetermined developing rate with reference to the above-mentioned look-up table. In connection, characteristic linewidth CD (Critical Dimension) may be established in place of the developing rate.

Next, under the operation of the control unit 240, the component of the developing fluid is controlled (i.e. quality governing) so that its TMAH concentration becomes the target TMAH concentration calculated in the above way. In detail, the valves 210, 212, 216, of the respective pipes 200, 204, 208 are opened appropriately. With the opening of the valve 210, for example, 20% TMAH solution as the concentrate TMAH solution is supplied from the concentrate TMAH solution source 198 into the blending tank 186 through the concentrate TMAH solution pipe 200. With the opening of the valve 212, for example, pure water as the solvent is supplied from the solvent source 202 into the blending tank 186 through the solvent pipe 204. With the opening of the valve 216, the developing fluid is discharged from the blending tank 186 to the outside through the drain pipe 208.

In this way, by blending the developing fluid in the blending tank 186 with the concentrate TMAH solution (20% TMAH solution) and/or the solvent (pure water), it is carried out to change the TMAH concentration of the developing fluid while maintaining the resist concentration. Normally, since the resist concentration increases as the number of times of reusing the developing fluid, that is, the number of recycling increases, it is carried out to change the TMAH concentration in the decreasing direction, as mentioned with FIG. 7. Therefore, the blending of the developing fluid in the blending tank 186 with the solvent (pure water) allows the TMAH concentration to be controlled for the next reusing of the developing fluid.

In this blending, the circulating pump 220 is operated to stir the developing liquid in the blending tank 186. The concentration measuring unit 222 picks the developing fluid in the blending tank 186 at any time. Further, the concentration measuring unit 222 measures the alkaline concentration, i.e. the TMAH concentration resist by the conductivity measuring method and transmits the detection result of TMAH concentration to the control unit 240. When a measured value of TMAH concentration obtained by the concentration measuring unit 222 reaches the above calculated concentration, the control unit 240 returns all the valves 210, 212, 216 to their closed conditions to stop the operation of the circulating pump 220.

After completing the above-mentioned blending operation for controlling the TMAH concentration, the developing fluid in the blending tank 186 is transferred to the supply tank 188 at the right time. Under the control of the control unit 186, it may be carried out to both open the valve 214 in the transfer pipe 206 and operate the pump 226 after the supply tank 199 was once emptied. In this way, the supply tank 188 is supplied with the recycled developing fluid having the TMAH concentration controlled in the blending tank 186, collectively.

When spraying or mounting the developing fluid onto the surface to be processed of the substrate G at the developing part 126 in the above way, the control unit 240 controls to open the valve 232 and drive the pump 228, so that the developing fluid in the supply tank 188 is fed to the developer nozzles DN through the developer supply pipe 224. The resist film on the substrate G dips in the developing fluid supplied from the developer nozzles DN, so that unnecessary portions (photosensitive or non-photosensitive portions) except the resist pattern dissolve into the developing fluid. Regarding this recycled developing fluid, it is noted that the TMAH concentration becomes lower than the standard value (2.38%) in the ratio proportional to the number of recycling due to the above component control in the blending tank 186 while the previously-dissolved resist component (resin) is accumulated by a quantity proportional to the number of recycling. Consequently, at the present reusing of the developing fluid, the development is performed at a constant developing rate equal to that at the previous reusing, so that the uniformity in both CD and development can be ensured.

Note, as occasion demands, it is also possible to stop the supply of the recycled developing fluid from the supply tank 188 and further start the supply of new liquid (2.38% TMAH solution) from the concentrate TMAH solution source 235. In this case, a new liquid, i.e. the new developing fluid is integrated with the collected developing fluid collected by the above-mentioned collecting mechanism after being once used in the developing fluid 126. Then, in order to control the TMAH concentration, both of the component control and the blending process are applied to the developing fluid in the blending tank 186 and continuously, the same fluid is provided for recycle through the supply tank 188.

As mentioned above, when reusing the developing fluid, the developer circulating recycle system 180 of the invention does not make the TMAH concentration keep the standard value (2.38%) of a new solution liquid as in the past conventional but controls the developing fluid to have a TMAH concentration allowing the influence of resist component on the developing rate to be canceled corresponding to the present resist concentration thereby making sure of the uniformity in development. According to the invention, since the developing fluid can be reused repeatedly and effectively with high reliability, it is possible to save the consumption of the developing fluid remarkably.

It is noted that the quantity of resist dissolving in the developing fluid increases as the recycling number increases. Since the ordinary absorption photometry has a limitation in the range of measuring the resist concentration (e.g. 0.1 to 1.5 Abs.), there arises a possibility that the number of recycling the developing fluid is restricted due to the above limitation in the range of measuring the resist concentration in spite of the possibility of reusing the developing fluid itself. To cope with this problem, it may be performed in the concentration measuring unit 222 to dilute the developing fluid (sample) picked up from the blending tank 186 with a solvent at a predetermined mixing ratio. In connection, the resist concentration of the so-diluted developing fluid is detected by the absorption photometry and successively, the measured vale of resist concentration of the diluted developing fluid is converted to a measured value of resist concentration of the sample developing fluid.

Figure 8:
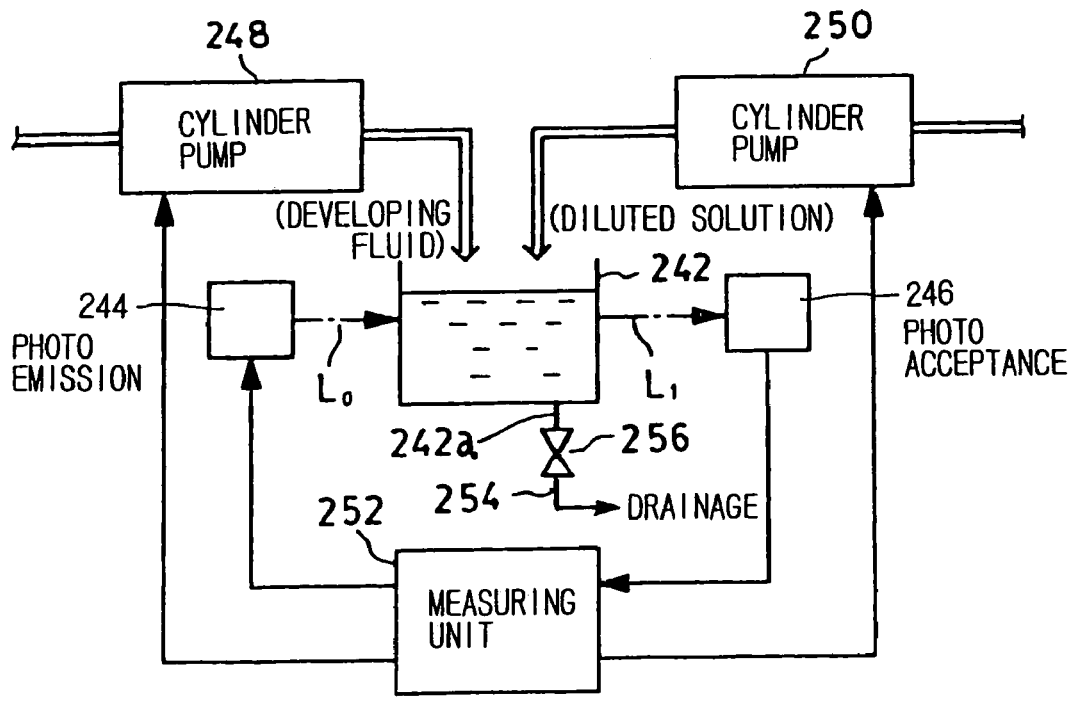
FIG. 8 is a block diagram showing one constituent example of a resist-concentration measuring part of a concentration measuring unit in the embodiment of the present invention.

FIG. 8 shows one example in constitution of a resist-concentration measuring part in the concentration measuring unit 222. This resist-concentration measuring part comprises a transparent measuring container 242, a light emitter 244 and a light receptor 246 both opposing each other over the measuring container 242, a flow control pump, for example, a cylinder type pump 248 for supplying the measuring container 242 with the developing fluid in the blending tank 186 (FIG. 2), another flow control pump, for example, a cylinder type pump 250 for supplying the measuring container 242 with a solvent (e.g. pure water) from a not-shown solvent container and a measuring circuit 252 to execute calculations for measuring the resist concentration. The measuring container 242 is provided, at its bottom, with a drain port 242a which is connected to a drain pipe 254. A valve 256 is interposed in the drain pipe 254. The measuring circuit 252 includes a control circuit to control the operations of the constituents (pumps, light emitter, etc.).

In the resist-concentration measuring part constructed above, it is normally carried out to take the developing fluid in the blending tank 186 (FIG. 6) only into the measuring container 242 by means of the pump 248. Next, the light emitter 244 emits a light ray L0 having a predetermined (known) optical power from the emitter 244 into the sample liquid (developing fluid) in the measuring container 242. While, the light receptor 246 receives a light ray L1 passing through the container 242 to measure an optical power of the lay L1. Then, the measuring circuit 252 calculates a measured vale (resist concentration) of the sample liquid on appropriate correction resulting from the ratio in optical power of the incident light L0 to the transmitted light L1.

When the measure value obtained in the above way reaches an upper limit in the measuring range or a saturated value (1.5 Abs.), the developing fluid in the blending tank 186 and the pure water in the solvent container are respectively introduced into the measuring container 242, with a predetermined mixing ratio, for example, 1:2, to produce a diluted developing fluid having a resist concentration reduced to one third (⅓) of the upper limit (or saturated value). Next, the resist concentration of the diluted developing fluid in the measuring container 242 is measured by using the absorption photometry and successively, the resist concentration of the developing fluid in the blending tank 186 is obtained by a conversion to multiply the measured resist concentration by the reciprocal of the dilution rate.

However, it should be noted that if the resist concentration is elevated too much, it becomes hard to maintain the uniformity in development. Therefore, it is preferable that when the measured resist concentration after conversion reaches a predetermined acceptable upper limit, for example, 2.0 Abs, the blending operation is stopped to discard the developing fluid in the blending tank 186.

Here noted that, in the above-mentioned embodiment, there is employed one method comprising the steps of: measuring a resist concentration of the collected developing fluid accommodated in the blending tank 186; calculating an alkaline concentration for realizing the uniformity in development corresponding to the measuring result (i.e. a measured resist concentration); and finally controlling the component of the developing fluid so as to attain the so-calculated alkaline concentration.

Alternatively, there may be employed another method comprising the steps of: measuring an alkaline concentration of the collected developing fluid accommodated in the blending tank 186; calculating a resist concentration for realizing the uniformity in development corresponding to the measuring result (i.e. a measured alkaline concentration); and finally controlling the component of the developing fluid so as to attain the so-calculated resist concentration. In this case, the concentration measuring unit 222 is capable of detecting the alkaline concentration (TMAH concentration) of the collected developing fluid by the conductivity measuring method, as similar to the former method. On the other hand, the control unit 240 can calculate a measured resist concentration corresponding to the measured TMAH concentration while referring to a data base describing a relationship or function between the resist concentration and the TMAH concentration in order to maintain a constant developing rate.

Then, under the control of the control unit 240, it may be performed to control the component of the developing fluid so that the resist concentration of the developing fluid in the blending tank 186 becomes the above-calculated resist concentration. Normally, since the resist concentration increases as the number of times of reusing the developing fluid, that is, the number of recycling increases, it is performed from the relationship shown in FIG. 7 to change the TMAH concentration in the decreasing direction in order to make sure of the uniformity in development. In order to reduce the resist concentration of the developing fluid in the blending tank 186, it is desirable to add the concentrate TMAH solution (20% TMAH solution) and the solvent (pure water) appropriately at the same time of reducing the quantity of the developing fluid due to its drainage through the drain pipe 208. Alternatively, the blending tank 186 may be supplied with a new liquid (2.38% TMAH solution) in the blending operation.

In this case, the concentration measuring unit 222 picks the developing fluid in the blending tank 186 at any time. Further, the concentration measuring unit 222 measures the resist concentration by the absorption photometry and transmits the detection result of resist concentration to the control unit 240. When a measured value of resist concentration obtained by the concentration measuring unit 222 reaches the above calculated resist concentration, the control unit 240 returns all the valves 210, 212, 216 to their closed conditions to stop the operation of the circulating pump 220, thereby completing the blending operation.

The above-mentioned embodiments are related to the developing unit (DEV) 94 of so-called "flat-feeding" type. However, the present invention is not limited to the above "flat-feeding" type developing unit only. Thus, the present invention is applicable to a variety of developing methods and apparatuses, for example, so-called "spin" type method where a substrate is rotated and the developing fluid is supplied to a surface to be processed of the substrate in rotation, so-called "dip" type method where a substrate is dipped in the developing fluid, etc. Additionally, the developing fluid on use is not limited to only the TMAH solution. Other alkaline solutions may be employed as the developing fluid.

In the present invention, a substrate to be processed is not limited to a LCD glass substrate only. The present invention is also applicable to various kinds of substrates for flat panel display, semiconductor wafer, CD substrate, glass substrate, photo mask, printed baseplate, etc.

As mentioned above, according to the developing method and the developing apparatus of the present invention, it is possible to make sure of the uniformity in development in spite of recycling a developing fluid (developer) in multiple times. Additionally, since the developing fluid can be reused in any number of times with high reliability effectively, it is possible to save the developer consumption remarkably.

What is claimed is:

1. A developing method for a substrate to be processed, comprising the steps of:
   collecting an alkaline developing fluid which has been used in a development process against a photo resist film on the substrate to be processed;
   measuring an alkaline concentration of the developing fluid collected in the collecting step;
   calculating a resist concentration corresponding to a measured value of the alkaline concentration for realizing a uniformity in development;
   controlling a component of the developing fluid in order to accomplish the resist concentration calculated in the calculating step; and
   reusing the developing fluid the component of which is controlled for the development process.

2. A developing method as claimed in claim 1, wherein the alkaline concentration is measured by using a conductivity measuring method at the measuring step of the alkaline concentration.

3. A developing method as claimed in claim 1, wherein the controlling step of the component of the developing fluid comprises the steps of:
   measuring the resist concentration of the developing fluid; and
   adding a concentrated developing solution and/or a solvent into the developing fluid until a measured value of the resist concentration of the developing fluid accords with the resist concentration calculated at the calculating step.

4. A developing method as claimed in claim 1, wherein the developing fluid is a TMAH solution, while the alkaline concentration is a TMAH concentration.

* * * * *